(12) United States Patent
Iaciofano et al.

(10) Patent No.: US 7,133,795 B1
(45) Date of Patent: Nov. 7, 2006

(54) TECHNIQUES FOR TESTING AN ELECTRONIC SYSTEM USING IN-LINE SIGNAL DISTORTION

(75) Inventors: Edward Iaciofano, Hopedale, MA (US); Thomas Laviolette, Sudbury, MA (US)

(73) Assignee: EMC Corporation, Hopkinton, MA (US)

( * ) Notice: Subject to any disclaimer, the term of this patent is extended or adjusted under 35 U.S.C. 154(b) by 16 days.

(21) Appl. No.: 11/020,722

(22) Filed: Dec. 23, 2004

(51) Int. Cl.
*G06F 19/00* (2006.01)
*G01R 31/28* (2006.01)

(52) U.S. Cl. .................. 702/108; 702/186; 714/715

(58) Field of Classification Search .......... 702/39, 702/108, 117, 118, 122, 182, 183, 185, 186; 701/16, 133; 714/43, 715, 724, 725; 455/323; 710/38; 711/113; 382/251; 375/240.26
See application file for complete search history.

(56) References Cited

U.S. PATENT DOCUMENTS

| | | | |
|---|---|---|---|
| 5,953,689 A | 9/1999 | Hale et al. | 702/186 |
| 6,473,871 B1 * | 10/2002 | Coyle et al. | 714/715 |
| 6,681,353 B1 | 1/2004 | Barrow | 714/725 |
| 6,775,720 B1 | 8/2004 | Glynn | 710/38 |
| 6,845,344 B1 | 1/2005 | Lally et al. | 702/186 |
| 6,865,514 B1 | 3/2005 | Goguen et al. | 702/186 |
| 6,948,031 B1 | 9/2005 | Chilton | 711/113 |
| 6,968,091 B1 | 11/2005 | Faibish et al. | 382/251 |
| 7,023,924 B1 | 4/2006 | Keller et al. | 375/240.26 |

* cited by examiner

*Primary Examiner*—Michael Nghiem
*Assistant Examiner*—John Le
(74) *Attorney, Agent, or Firm*—BainwoodHuang (57) ABSTRACT

A technique for testing an electronic system (e.g., a computer system) involves intercepting an initial signal of the electronic system, modifying the initial signal with a distortion to form a distorted signal, and introducing the distorted signal into the electronic system in place of the initial signal. The technique further involves obtaining, from the electronic system, a result having one of (i) a first value indicating that the electronic system handled the distorted signal in a normal operating mode, and (ii) a second value indicating that the electronic system handled the distorted signal in an error handling mode which is different than the normal operating mode.

22 Claims, 6 Drawing Sheets

TECHNIQUES FOR TESTING AN ELECTRONIC SYSTEM USING IN-LINE SIGNAL DISTORTION

BACKGROUND

Computer system manufacturers typically perform system level tests for a variety of reasons, e.g., to verify correct operation, to confirm that the computer systems operate under certain worst case scenarios, to debug known or potential problems, etc. Accordingly, there are a variety of conventional approaches to testing a computer system.

One conventional approach to testing a computer system (hereinafter referred to as the "conventional static bit pattern approach") involves the manufacturer replacing one of the components of the computer system with hardware that is configured to inject static bit patterns into the system. For example, suppose that a manufacturer has a computer system which connects a circuit board and an array of disk drives together using a Fibre Channel-Arbitrated Loop (FC-AL), and wishes to determine how much margin exists within the FC-AL. There exists conventional off-the-shelf electronic equipment that will enable the manufacturer to mimic one of the original FC-AL devices (e.g., the circuit board or one of the disk drives). Along these lines, the manufacturer removes the original FC-AL device, and replaces it with the off-the-shelf electronic equipment. The manufacturer then stores a static bit pattern in the off-the-shelf electronic equipment and plays the static bit pattern into the FC-AL. The remaining FC-AL devices then respond to the static bit pattern as if the off-the-shelf electronic equipment was the original FC-AL device. The manufacturer is capable of re-playing the static bit pattern slightly differently such as by speeding up or slowing down the output to determine whether the remaining FC-AL devices are still capable of correctly processing the static bit pattern. Accordingly, the manufacturer has the ability to determine whether portions of the computer system can operate under certain worst case conditions.

Another conventional approach to testing a computer system (hereinafter referred to as the "conventional marginal device approach") involves the manufacturer replacing one of the components of the computer system with another component that is known to be on the verge of unacceptability. In the above-described FC-AL situation, the manufacturer replaces an original FC-AL device with a marginal FC-AL device such as an FC-AL device with a Fibre Channel (FC) transmitter that the manufacturer knows is extremely weak and almost at the point of being faulty. The manufacturer runs the computer system with the marginal FC-AL device to see whether any of the remaining FC-AL devices fail, e.g., an adjacent FC-AL device downstream may fail due to tolerance stack-up if that device has a marginal FC receiver. Accordingly, the manufacturer again has the ability to determine whether portions of the computer system can operate under certain worst case conditions.

SUMMARY

Unfortunately, there are deficiencies to the above-described conventional approaches to testing a computer system. For example, in the above-described conventional static bit pattern approach, the conventional off-the-shelf electronic equipment is inflexible and limited in functionality. In particular, the manufacturer is unable to test the computer system for an extended time period (e.g., a time beyond playing the bit pattern), or perform a wide variety of operations (e.g., respond to dynamically generated communications from other devices), using the conventional off-the-shelf electronic equipment. Rather, the manufacturer is limited to replaying the static bit pattern stored in the conventional off-the-shelf equipment. If the manufacturer decides to run a more-extensive test (e.g., a longer test or a test which performs a different operation), the manufacturer is required to store and play a different static bit pattern (e.g., a longer static bit pattern, a static bit pattern which defines a different operation, etc.).

Similarly, in the above-described conventional marginal device approach, the conventional marginal device is inflexible and uncontrollable. In particular, the manufacturer is unable to change the electronic attributes of the test. For example, if the marginal device suffers from a weak FC transmitter, the manufacturer cannot use this device to perform a different test such as testing the computer system with a noisy FC transmitter. Rather, the manufacturer must find another marginal device (e.g., a FC-AL device with a noisy FC transmitter) to run a noisy FC transmitter test.

In contrast to the above-described conventional computer system testing approaches, improved testing techniques are capable of testing an electronic system using in-line signal distortion, i.e., intercepting a dynamically generated signal from the electronic system and injecting the signal with a distortion back into the electronic system. Such techniques enable a user to extensively characterize the electronic system by distorting an actual signal of the system in real-time. Accordingly, such techniques enable longer tests and tests which involve a variety of different operations (i.e., dynamically generated signals are capable of being intercepted and distorted for any length of time). Moreover, such techniques alleviate the need to store and play static bit patterns as in the above-described conventional static bit pattern approach. Additionally, such techniques alleviate the need to replace original devices with marginal devices as in the above-described marginal device approach.

One embodiment is directed to a technique for testing an electronic system (e.g., a computer system). The technique involves intercepting an initial signal of the electronic system, modifying the initial signal with a distortion to form a distorted signal, and introducing the distorted signal into the electronic system in place of the initial signal. The technique further involves obtaining, from the electronic system, a result having one of (i) a first value indicating that the electronic system handled the distorted signal in a normal operating mode, and (ii) a second value indicating that the electronic system handled the distorted signal in an error handling mode which is different than the normal operating mode.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Improved testing techniques are capable of testing an electronic system using in-line signal distortion, i.e., intercepting a dynamically generated signal from the electronic system and injecting the signal with a distortion back into the electronic system. Such techniques enable a user to extensively characterize the electronic system by distorting an actual signal of the system in real-time. As a result, such techniques enable longer tests and tests which involve a variety of different operations, i.e., dynamically generated signals are capable of being intercepted and distorted for any length of time. Thus, such techniques alleviate the need to store and play static bit patterns as in the above-described conventional static bit pattern approach. Furthermore, such techniques alleviate the need to replace original devices with marginal devices as in the above-described marginal device approach.

Figure 1:
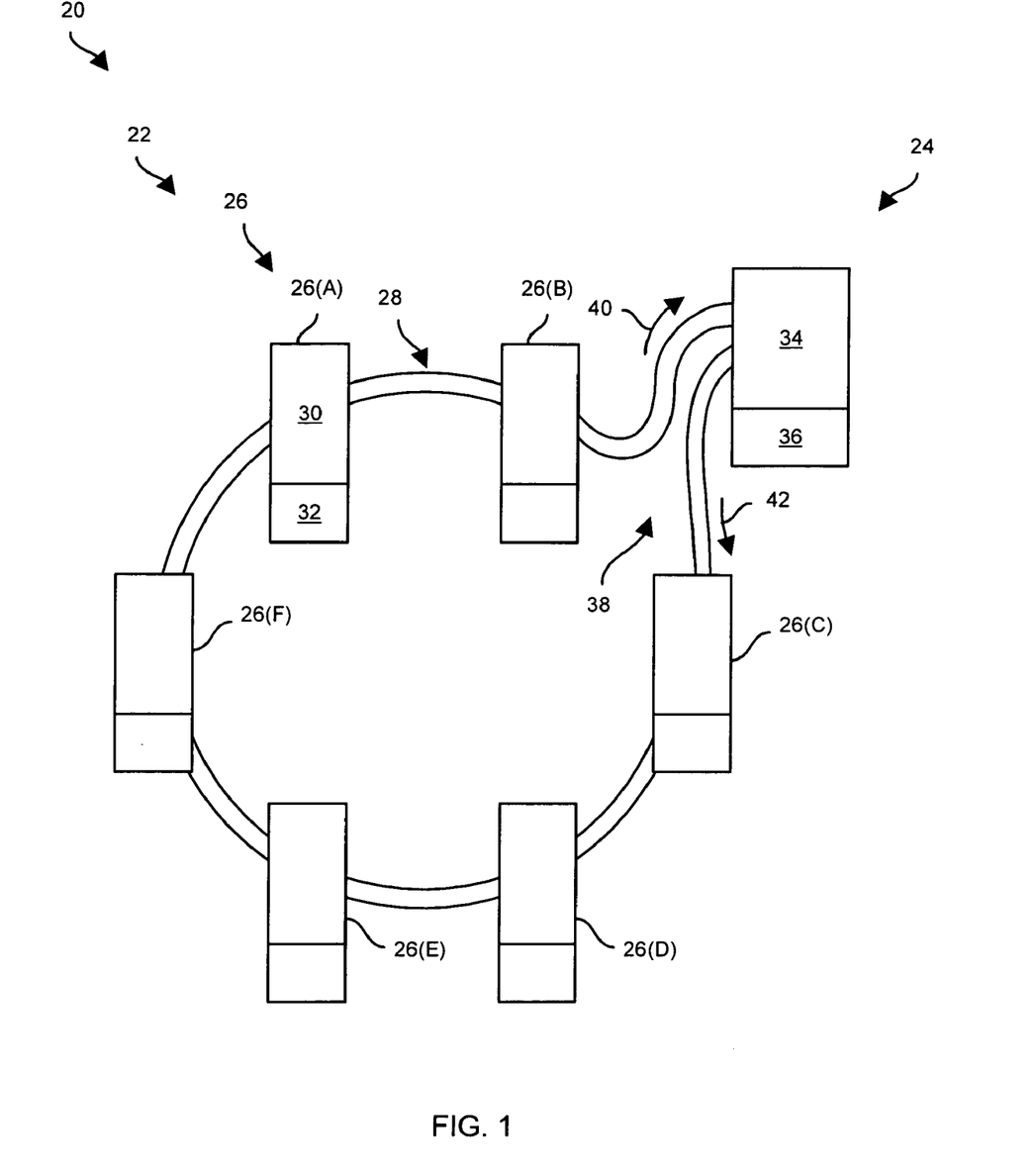
FIG. 1 is a block diagram of a characterization environment having an electronic system under test and a tester for testing the electronic system.

FIG. 1 shows a test configuration or characterization environment 20 having an electronic system 22 and a tester 24. The electronic system 22 includes multiple components 26 which are configured to communicate with each other through data paths of a communications medium 28. Each component 26 includes processing circuitry 30 and status indication circuitry 32 (e.g., LEDs). The tester 24 includes an in-line signal generator 34 and an input/output (I/O) device 36. The in-line signal generator 34 of the tester 24 connects to the electronic system 22 at a location 38 in an in-line manner (e.g., by rerouting cable lines, cutting through and tapping signal traces, etc.).

During operation of the electronic system 22, the components 26 of the electronic system 22 generate electronic signals 38 and exchange these signals 38 with each other through the communications medium 28. The tester 24 is configured to test the electronic system 22 as the electronic system 22 operates. In particular, the in-line signal generator 34 of the tester 24 enables direct manipulation of signal parameters of signals originating externally from the tester 24, in real-time. That is, the tester 24 is configured to (i) intercept an initial signal 40 originating from a component 26 of the system 20, (ii) modify that signal 40 with controlled amounts of distortion (e.g., amplitude, rise/fall time, jitter, etc.) to form a distorted signal 42, and (iii) introduce the distorted signal 42 into the electronic system 22 in place of the initial signal 40. After a user runs the tester 24 to provide signal distortion in a first manner (e.g., an amplitude distortion), the user is capable of changing how the in-line signal generator 34 modifies the initial signal 40 on the fly by operating the I/O device 36 (e.g., adding another distortion component to the signal). Accordingly, the user is well-equipped to perform precise performance margin testing and characterization of the data paths of the electronic system 22 (see the communications medium 28 in FIG. 1).

It should be understood that the user is capable of obtaining test results from the test configuration 20 in a variety of ways. One way is for the user to precisely monitor the attributes of the distorted signal 42 using the I/O device 36 (e.g., sample and view changes to the signals). Another way is to functionally monitor the operation of the electronic system 22 (e.g., using a control console of the system 22, viewing the status indication circuitry 32 for a change in component status, etc.).

For example, the user can incrementally increase a particular signal distortion using the tester 24 and monitor the status indication circuitry 32 of the components 26. Initially, the status indication circuitry 32 may provide initial values (e.g., green LED light) indicating that the electronic system 22 can handle the distorted signal 42 in a normal operating mode, i.e., without error. As the user increases the distortion, the user may eventually observe that the status indication circuitry 32 provides a second value (e.g., one or more red LED lights) indicating that the electronic system 22 handles the distorted signal 42 in an error handling mode which is different than the normal operating mode. Since the tester 24 does not rely on artificial static bit patterns as in a conventional static bit pattern test, or swapping of components with marginal components as in a conventional marginal device test, the tester 24 provides the user with enhanced testing flexibility. That is, the user is capable of running the tester 24 during any operation of the electronic system 22 and for any length of time. Moreover, the tester 24 is capable of preserving and/or enhancing any distortions or signal anomalies originating from the electronic system 20.

By way of example only, the communications medium 28 is a Fibre Channel Arbitrated Loop (FC-AL), and the components 26 are Fibre Channel devices (e.g., processing modules, storage units, etc.) which form a data storage system configured to store and retrieve data on behalf of one or more external host computers. Accordingly, the signals 38 which are exchanged by the components 26 are serial, high frequency (e.g., 1 GHz to 6 GHz), differential pair signals. Other types of signals are suitable as well such as Rapid I/O signals, the Gigabit Ethernet signals, the I2C signals, and so on.

Also by way of example only, the electronic system 22 includes six Fibre Channel devices 26(A), 26(B), 26(C), 26(D), 26(E), 26(F) arranged in a ring. Other numbers of devices 26 and topologies are suitable for use by the electronic system 20 as well such as hub-and-spoke or star topologies, backbone or multi-drop bus topologies, irregular topologies, and so on. Further details will now be provided with reference to FIG. 2.

Figure 2:
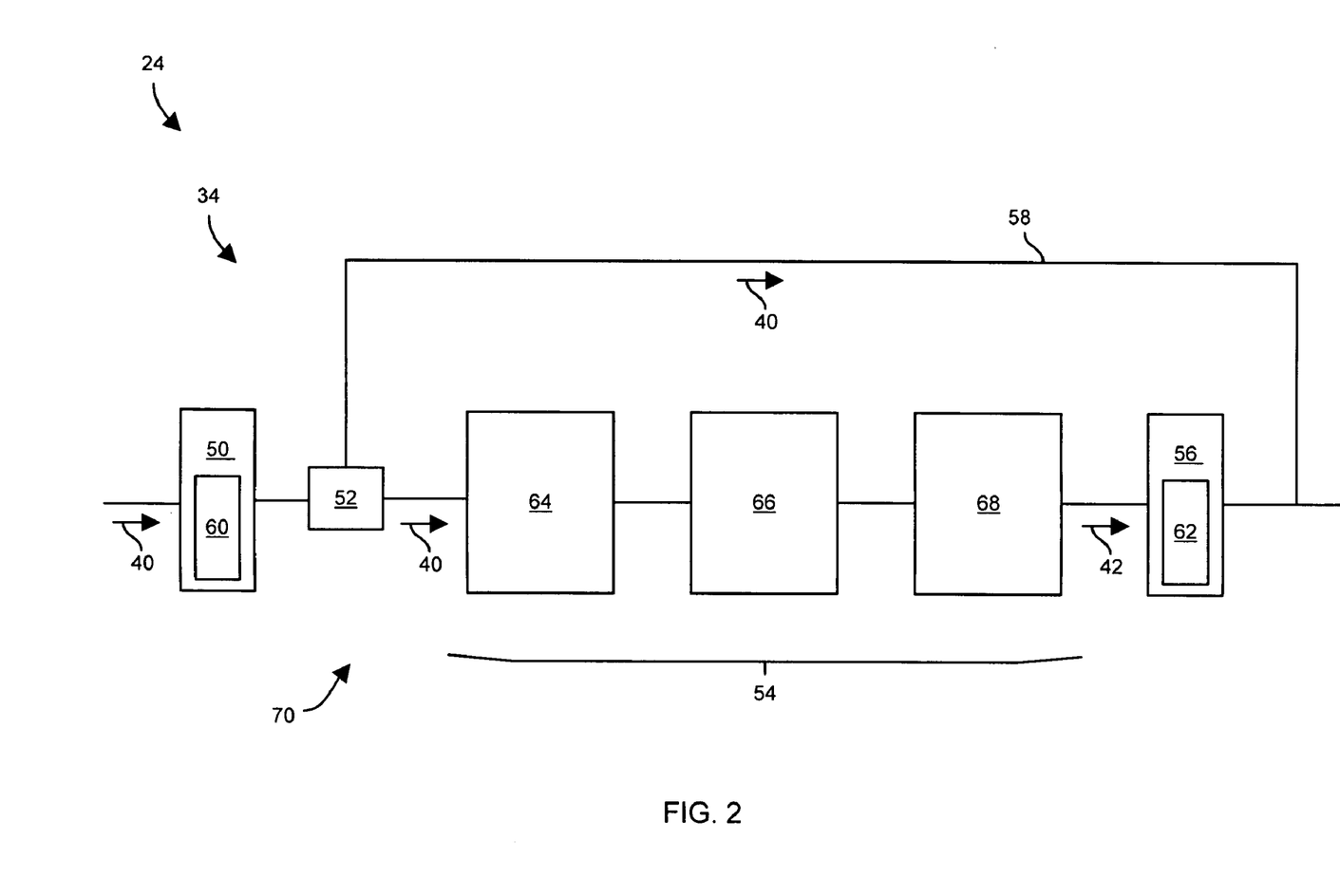
FIG. 2 is a detailed block diagram of portion of the tester of FIG. 1.

FIG. 2 is a detailed block diagram of the in-line signal generator 34 of the tester 24 of the test configuration 20. The in-line signal generator 34 includes an input stage 50, a switch 52, a control stage 54, an output stage 56, and a bypass pathway 58. The input stage 50, the switch 52, the control stage 54, and the output stage 56 are connected in a pipelined manner. The bypass pathway 58 connects to the switch 52 and provides an alternative signal path which circumvents the control stage 54 and the output stage 56.

The input stage 50 includes an input analog buffer circuit 60 which is configured to connect to output circuitry of the electronic system 22 (also see FIG. 1). Similarly, the output stage 56 includes an output analog buffer circuit 62 which is configured to connect to input circuitry of the electronic system 22 (FIG. 1). The control stage 54 includes an amplitude control module 64, a rise and fall time control module 66, and a noise generation module 68 which are arranged serially between the switch 52 and the output stage 56.

The input analog buffer circuit 60 acts as an input interface to the electronic system 22 (also see FIG. 1) by intercepting and preserving the initial signal 40 with any distortions or anomalies caused by the electronic system 22. Similarly, the output analog buffer circuit 62 acts as an output interface to the electronic system 22 by providing the distortion signal 42 into the electronic system 22 in place of the initial signal (FIG. 1).

During operation of the tester 24, a user provides input 70 through the I/O device 36 to control the operation of the tester 24. For example, the user is capable of directing the in-line signal generator 34 to alter the initial signal 40, and thus determine how the electronic system 22 responds to such alterations for precise performance margin testing and characterization of the electronic system 22. Specifically, the user is capable of setting the switch 52 to a first position (e.g., "ON") which directs the in-line signal generator 34 to provide the distorted signal 40. Next, the user directs at least one of the modules 64, 66, 68 of the control stage 54 to provide distortion to the initial signal 40 to form the distorted signal 42. In response, the output stage 56 outputs the distorted signal 42 into the electronic system 22.

The user is also capable of setting the switch 52 to a second position (e.g., "BYPASS") which circumvents the operation of the control stage 54 and the output stage 56. Here, the initial signal 40 is allowed to pass cleanly from the input stage 50 back into the electronic system 22 through the bypass pathway 58, but with any anomalous or distorted analog characteristics existing within the initial signal 40 at the time of interception due to the operation of the input analog buffer circuit 60. Accordingly, the user of the tester 24 is capable of assessing whether connection of the tester 24 has any affect on the operation of the electronic system 22. That is, running the tester 24 with such circumventing allows the user to determine whether operation of the electronic system 22 is at all inadvertently degraded by the simple presence of the tester 24 rather than purposefully by the control stage 54 of the tester 24.

It should be understood that the bypass pathway 58 is described above as bypassing the output stage 56 by way of example only and, in other arrangements, the bypass pathway 58 circumvents only the control stage 54 and does not circumvent the output stage 56. Other switching configurations are suitable for use as well for the tester 24 (e.g., mechanical switching, electronic switching, front-end switching, back-end switching, etc.). Further details of the tester 24 will now be provided with reference to FIG. 3.

Figure 3:
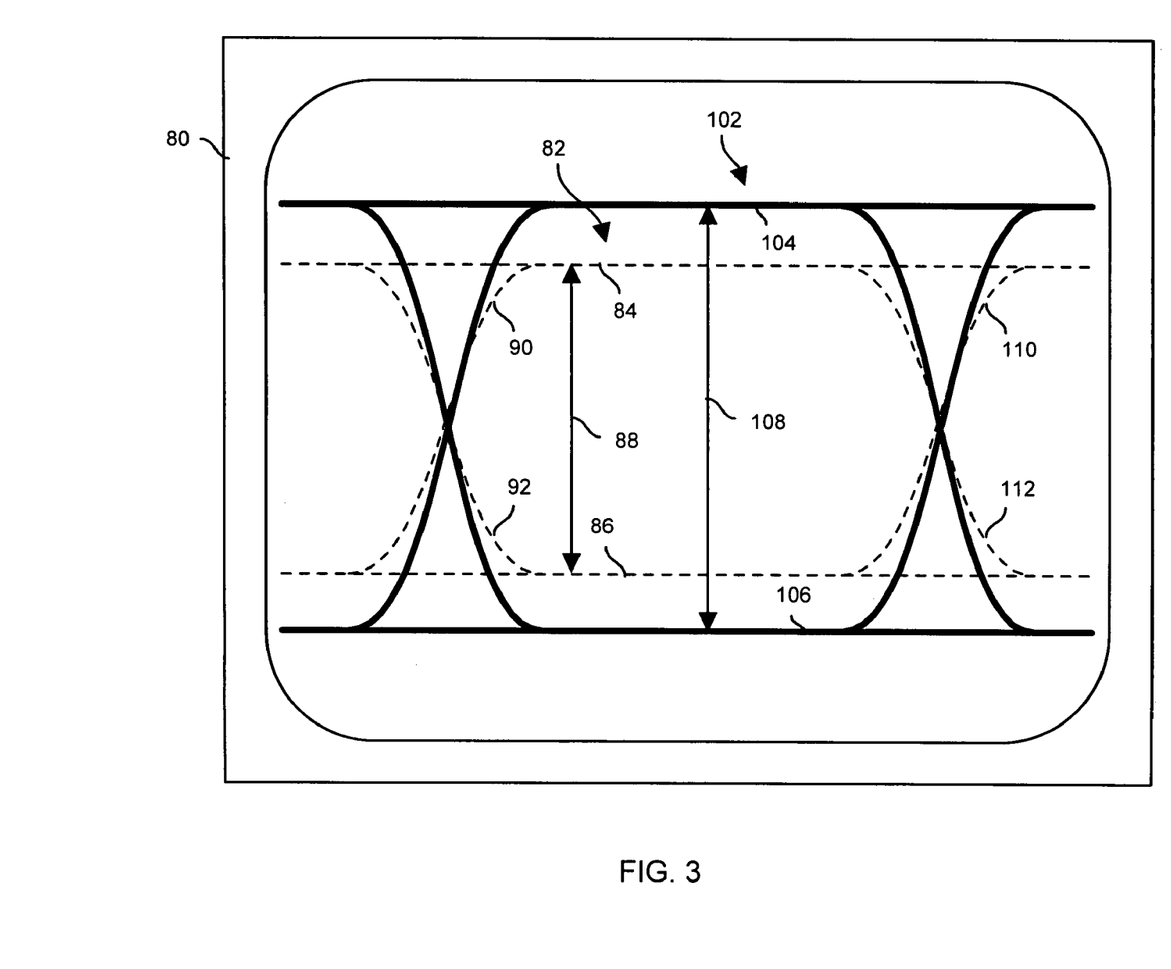
FIG. 3 is a view of a display of the tester when modifying a signal of the electronic system with an amplitude distortion.

FIG. 3 shows a view of a display 80 of the I/O device 36 of the tester 24. The display 80 initially shows an eye-shaped pattern 82 (the dashed lined pattern in FIG. 3) which is generated by sampling the output of the tester 24 (e.g., a high-frequency different pair signal) as it enters the electronic system 22. In particular, the switch 52 is initially set to the second position (i.e., "BYPASS") so that the initial signal 40 circumvents the control stage 54 and the output stage 56 and re-enters the electronic system 22. The display 80 shows signal samples taken from the re-entry point adjacent the output stage 56.

As shown in FIG. 3, the eye-shaped pattern 82 illustrates particular characteristics of the initial signal 40. For example, the eyes-shaped pattern 82 has a maximum 84 and a minimum 86, and the distance between the maximum 84 and minimum 86 is an amplitude 88 of the initial signal 40. Additionally, the eyes-shaped pattern 82 has rising transitions 90 which represent rising edges of the initial signal 40, and falling transitions 92 which represent falling edges of the initial signal 40. Since the input analog buffer circuit 60 substantially preserves analog characteristics of the initial signal 40, any distortions or anomalies existing in the initial signal 40 are preserved and displayed in the display 80.

Suppose that the user now decides to add one or more distortion components to the initial signal 40 and assess whether the electronic system 22 is capable of withstanding such distortion. In particular, suppose that the user decides to increase the amplitude 88. To effectuate this change, the user sets the switch 52 from the second position (i.e., "BYPASS") to the first position (i.e., "ON") which sends the initial signal 40 to the control stage 54. The user then directs the amplitude control module 64 to output the distorted signal 42 with an amplitude that is greater than the amplitude 88 of the initial signal 40. Preferably, the user inputs such direction into the I/O device 36 (FIG. 1) which, in turn, provides the input 70 control commands to the control stage 54 (FIG. 2).

The amplitude control module 64 responds to the input 70 by providing the distorted signal 40 with characteristics similar to the initial signal 40, but with a different amplitude. That is, as the FC-AL device 26(B) outputs an FC-AL signal, i.e., the initial signal 40, the tester 24, in real-time, intercepts the initial signal 40, generates the distorted signal 40 by adding a distortion (e.g., an amplitude increase) to the initial signal 40, and outputs the distorted signal 40 to the FC-AL device 26(C) in place of the initial signal 40 (also see FIG. 1). Since the display 80 shows samples obtained adjacent the output stage 56 of the tester 24, the eye-shaped pattern 82 changes to a new eye-shaped pattern 102 (i.e., the pattern shown with thickened lines for illustration purposes only) which represents the distorted signal 42, thus providing feedback to the user. Here, the new eye-shaped pattern 102 has a maximum 104 and a minimum 106, and the distance between the maximum 104 and minimum 106 is an amplitude 108 of the distorted signal 42. Additionally, the eye-shaped pattern 102 has rising transitions 110 which represent rising edges of the distorted signal 42, and falling transitions 112 which represent falling edges of the distorted signal 42.

At this point, the user is then capable of monitoring the affect of the amplitude change in the electronic system 22. In particular, the user is capable of viewing the status indicators 32 of the devices 26 (FIG. 1) to determine whether any of the devices 26 transitions into an error handling mode rather than a normal processing mode (e.g., a change in colored LED lights). Such a transition occurs if a device 26 is no longer capable of interpreting communications. Accordingly, the tester 24 is capable of mimicking a problematic device (e.g., a device 26 having a faulty transmitter) but using a dynamically obtained actual signal 40 from the electronic system 22. As a result, the tester 24 is capable of maintaining operation indefinitely and distorting any signal it can intercept thus providing maximum flexibility and robustness.

It should be understood that the user is capable of distorting the initial signal 40 by lowering the amplitude. In this situation, the user directs the amplitude control module 64 of the tester 24 to decrease the amplitude of the distorted signal 42. As a result, the eye-shaped pattern 102 is capable of looking smaller (shorter) than the eye-shaped pattern 82. Further details will now be provided with reference to FIG. 4.

Figure 4:
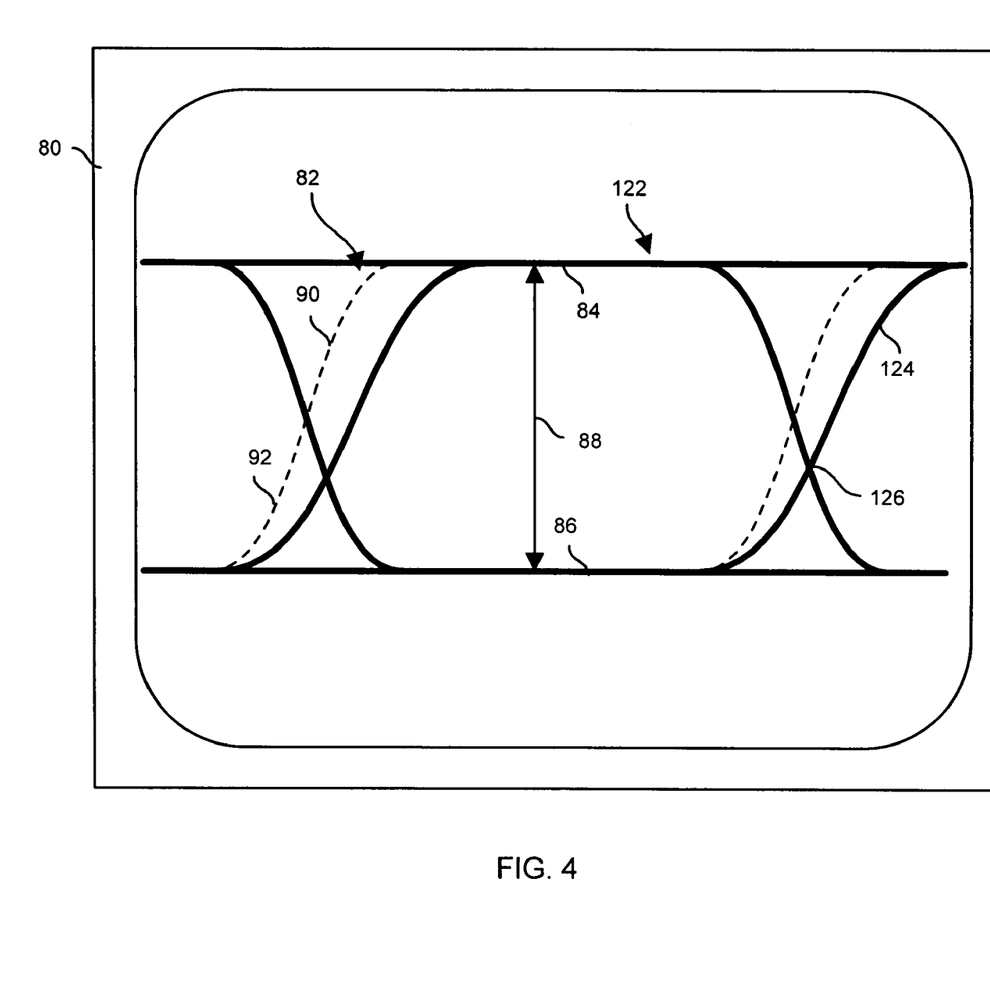
FIG. 4 is a view of a display of the tester when modifying a signal of the electronic system with a rise time or fall time distortion.

FIG. 4 is a view of the display 80 in the context of a change in either rise time or fall time by the user. For example, suppose that the user wishes to examine the effect of lengthening the rise time characteristics of the initial signal 40. To this end, the user provides input 70 that directs the rise and fall time control module 66 of the control stage

54 accordingly. The rise and fall time control module 64 responds by providing the distorted signal 40 with characteristics similar to the initial signal 40, but with a slower rise time.

Again, it should be understood that the user is capable of monitoring the effects of the distortion by the distorted signal 42 adjacent the output stage 56. As a result, the eye-shaped pattern 82 on the display 80 changes to the eye-shaped pattern 122 (i.e., the pattern shown with thickened lines for illustration purposes only). Here, the new eye-shaped pattern 122 for the distorted signal 42 has the same maximum 84, the same minimum 86, the same amplitude 88, and the same falling edge 92 as that of the initial signal 40. However, the rising edge 124 of the new eye-shaped pattern 122 is slower and thus lowering the crossing-point 126 of the eye-shaped pattern 122.

At this point, the user is then capable of monitoring the affect of the rise time change in the electronic system 22. Specifically, the user is capable of viewing the status indicators 32 of the devices 26 (FIG. 1) to determine whether any of the devices 26 transitions into an error handling mode rather than a normal processing mode. Such a transition occurs if a device 26 is no longer capable of interpreting communications. Thus, the tester 24 is capable of mimicking a marginally-performing device (e.g., a device 26 having a marginal transmitter or a signal line defect) but using a dynamically obtained actual signal 40 from the electronic system 22 for enhanced testing capabilities (i.e., precise margin testing).

It should be understood that the user is capable of distorting the initial signal 40 by increasing the rise time, or by modifying the fall time (increasing or decreasing) either instead or concurrently. In these situations, the user provides input 70 which directs the rise and fall time control module 66 of the tester 24 accordingly. As a result, the eye-shaped pattern 122 changes to provide the user with real-time feedback. Further details will now be provided with reference to FIG. 5.

Figure 5:
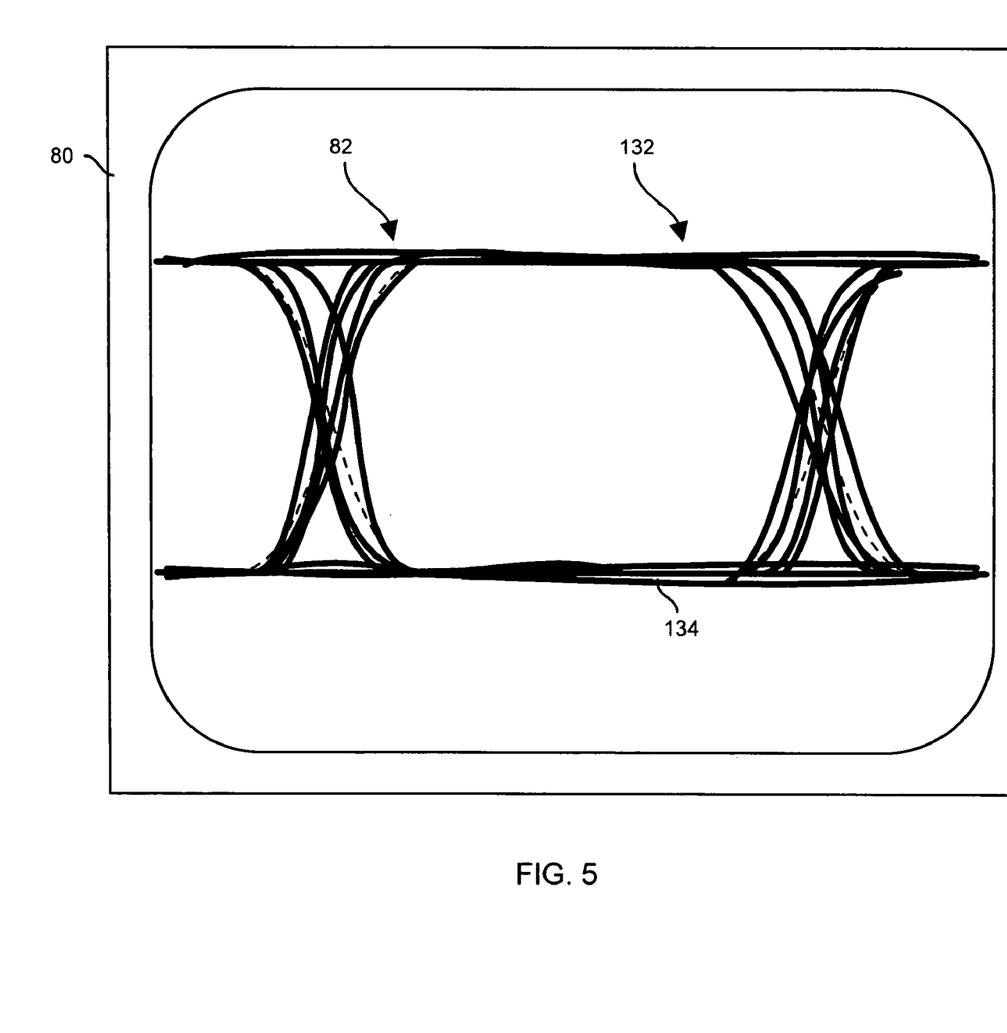
FIG. 5 is a view of a display of the tester when modifying a signal of the electronic system with a white noise distortion.

FIG. 5 is a view of the display 80 in the context of introduction of white noise distortion by the user. For example, suppose that the user wishes to examine the effect of adding random noise to the initial signal 40. To this end, the user provides input 70 that directs the noise generation module 68 of the control stage 54 to add white noise. The noise generation module 68 responds by providing the distorted signal 40 with characteristics similar to the initial signal 40, but with the random noise.

Here, the user is capable of monitoring the effects of the added noise by sampling the distorted signal 42 adjacent the output stage 56. As a result, the eye-shaped pattern 82 on the display 80 changes to the eye-shaped pattern 132 (i.e., the pattern shown with thickened lines for illustration purposes only) having jitter 134. By way of example, the eye-shaped pattern 132 is inconsistent due to the inability of the tester 24 to obtain a consistent signal sample thus providing the user with real-time feedback.

The user is then capable of monitoring the affect of the noise in the electronic system 22. In particular, the user is capable of viewing the status indicators 32 of the devices 26 (FIG. 1) to determine whether any of the devices 26 transitions into an error handling mode rather than a normal processing mode. Such a transition occurs if a device 26 is no longer capable of interpreting communications. Thus, the tester 24 is capable of mimicking a problematic device (e.g., a device 26 having a flaky transmitter) but using a dynamically obtained actual signal 40 from the electronic system 22 for improved testing.

It should be understood that the various modules 64, 66, 68 are capable of being used simultaneously to provide multiple or compound distortions concurrently. In particular, the distortion signal 40 is capable of including an amplitude change component (from the amplitude circuit 64), a rise time and fall time change component (from the edge adjustment circuit 66), and a noise component (from the noise circuit 68). That is, the user is capable of directing the tester 24 to provide any combination of distortion components within the distortion signal 40. Other types of signal components are capable of being included as well (e.g., spikes, added frequency components, etc.). Preferably, if noise is added, the noise is added last.

It should be further understood that the sampled distorted signal 42 is shown as distinct lines on the display 80 in FIG. 5 for illustration purposes only. In actuality, the high/low and low/high transitions would cause the view on the display 80 to change from distinct lines to wide bands. Further details will now be provided with reference to FIG. 6.

Figure 6:
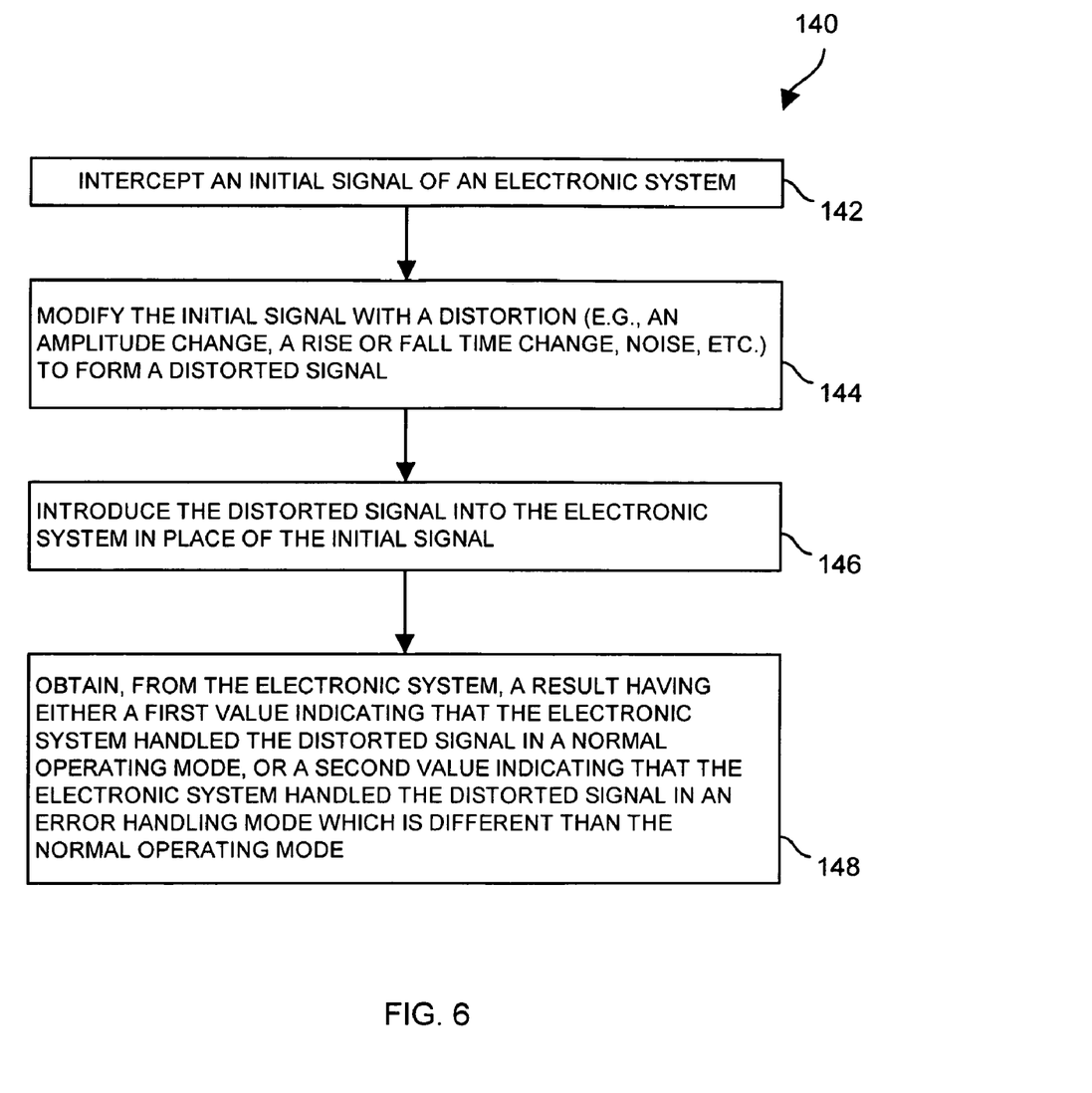
FIG. 6 is a flowchart of a procedure which is performed by a user of the tester of the characterization environment.

FIG. 6 is a flowchart of a procedure 140 which is performed by a user of the tester 24 of the characterization environment 20 when testing an electronic system 22. In step 142, the user configures the tester 24 to intercept an initial signal 40 of the electronic system 22. In some arrangements, the electronic system 22 is a data storage system and the initial signal 40 is a high-frequency serial signal such as an FC-AL signal.

In step 144, the user modifies the initial signal 40 with a distortion to form a distorted signal 42. In particular, the user directs the control stage 54 to generate the distorted signal 42 based on the initial signal 40 and one or more distortion components (e.g., an amplitude change, a rise/fall time change, jitter, etc.) in response to user input 70.

In step 146, the user directs the tester 24 to introduce the distorted signal 42 into the electronic system 22 in place of the initial signal 40. Since such introduction occurs dynamically on the fly, there is little or no latency provided by the tester 24. Accordingly, there is no threat that the receiving device 26 will inadvertently timeout due to lack of receipt of a signal. Rather, the tester 24 is configured to reliably provide the distorted signal 42 well within the timeout period thus enabling the user to assess the affects of the distorted signal 42 on the system 22.

In step 148, the user monitors the operation of the electronic system 22 by obtaining, from the electronic system 22, a result having one of (i) a first value indicating that the electronic system handled the distorted signal in a normal operating mode (e.g., viewing LEDs indicating normal operation), and (ii) a second value indicating that the electronic system handled the distorted signal in an error handling mode which is different than the normal operating mode (e.g., viewing at least one LED indicating that a device has detected an error). Accordingly, the user is capable of performing accurately controlled margin testing and characterization of the data paths within the electronic system 22 (e.g., high frequency serial data paths).

It should be understood that the steps of the procedure 140 typically occur in an ongoing and continuous manner, in real-time. That is, the user allows the tester 24 to perform steps 142, 144 and 146 while watching the system 22 for a change in activity (e.g., transition to an error handling situation). As a result, the user is capable of characterizing the system 22 in an organized and convenient manner, i.e., by incrementally changing the distortions to determine the margins and tolerances of the system 22.

As described above, improved testing techniques are capable of testing an electronic system 22 using in-line signal distortion, i.e., intercepting a dynamically generated signal 40 from the electronic system 22 and injecting a distorted signal 42, i.e., the initial signal 40 with a set of distortion components, back into the electronic system 22 in place of the initial signal 40. Such techniques enable a user to extensively characterize the electronic system 22 by distorting an actual signal 40 of the system 22 in real-time. Accordingly, such techniques enable longer tests and tests which involve a variety of different operations (i.e., dynamically generated signals are capable of being intercepted and distorted for any length of time). Moreover, such techniques alleviate the need to store and play static bit patterns as in the above-described conventional static bit pattern approach. Additionally, such techniques alleviate the need to replace original devices with marginal devices as in the above-described marginal device approach.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method for testing an electronic system, the method comprising:
   intercepting an initial signal of the electronic system;
   modifying the initial signal with a distortion to form a distorted signal;
   introducing the distorted signal into the electronic system in place of the initial signal; and
   obtaining, from the electronic system, a result having one of (i) a first value indicating that the electronic system handled the distorted signal in a normal operating mode, and (ii) a second value indicating that the electronic system handled the distorted signal in an error handling mode which is different than the normal operating mode;
   wherein the electronic system is a computer system;
   wherein intercepting the initial signal includes:
      receiving, as the initial signal, a serial data stream which is generated dynamically by the computer system in response to computerized operations performed by individual devices of the computer system; and
   wherein receiving the serial data stream includes:
      obtaining, as the serial data stream, a non-static, real-time electrical signal en route from a first device of the computer system toward a second device of the computer system.

2. The method of claim 1 wherein obtaining the non-static, real-time electrical signal includes:
   acquiring, as the non-static, real-time electrical signal, a differential pair signal.

3. The method of claim 2 wherein acquiring the differential pair signal includes:
   temporarily buffering the differential pair signal in an analog buffer circuit to preserve any pre-existing distortions in the differential pair signal.

4. The method of claim 1, further comprising:
   setting a switch from a first position which causes introduction of the distorted signal into the computer system in place of the initial signal to a second position which causes introduction of the initial signal into the computer system.

5. The method of claim 4 wherein the initial signal passes through an input analog buffer circuit prior to reaching the switch; wherein an output analog buffer circuit is configured to output the distorted signal; and wherein setting the switch from the first position to the second position includes:
   circumventing an output analog buffer circuit to introduce the initial signal rather than the distorted signal into the computer system.

6. The method of claim 1 wherein the initial signal has an initial amplitude, and wherein modifying the initial signal with the distortion to form the distorted signal includes:
   changing the initial amplitude to a new amplitude which is different than the initial amplitude to provide at least part of the distortion forming the distorted signal.

7. The method of claim 1 wherein the initial signal has an initial rise time, and wherein modifying the initial signal with the distortion to form the distorted signal includes:
   changing the initial rise time to a new rise time which is different than the initial rise time to provide at least part of the distortion forming the distorted signal.

8. The method of claim 1 wherein the initial signal has an initial fall time, and wherein modifying the initial signal with the distortion to form the distorted signal includes:
   changing the initial fall time to a new fall time which is different than the initial fall time to provide at least part of the distortion forming the distorted signal.

9. The method of claim 1 wherein modifying the initial signal with the distortion to form the distorted signal includes:
   introducing white noise as at least part of the distortion to form the distorted signal.

10. The method of claim 9 wherein modifying the initial signal with the distortion to form the distorted signal further includes:
    changing at least one of an amplitude of the initial signal, a rise time of the initial signal, and a fall time of the initial signal prior to introducing the white noise.

11. The method of claim 1, further comprising:
    disconnecting a conductor of the computer system to access the non-static, real-time electrical signal from a side of the conductor leading to the first device of the computer system.

12. The method of claim 11 wherein introducing the distorted signal into the computer system includes:
    injecting the distorted signal into another side of the conductor leading to the second device of the computer system.

13. The method of claim 1 wherein the individual devices of the computer system connect in a daisy-chained manner; and wherein obtaining the non-static, real-time electrical signal includes:
    acquiring, as the non-static, real-time electrical signal, a point-to-point signal which is outputted from the first device toward the second device.

14. An apparatus for testing an electronic system, comprising:
    an input stage which is configured to intercept an initial signal of the electronic system;
    a control stage coupled to the input stage, the control stage being configured to modify the initial signal with a distortion to form a distorted signal; and
    an output stage coupled to the control stage, the output stage being configured to introduce the distorted signal into the electronic system in place of the initial signal, the control stage enabling a user to select characteristics of the distortion and obtain, from the electronic system, a result having one of (i) a first value indicating that the electronic system handled the distorted signal in a normal operating mode, and (ii) a second value indicating that the electronic system handled the distorted signal in an error handling mode which is different than the normal operating mode;

wherein the electronic system is a computer system, and wherein the input stage includes:

an input analog buffer circuit configured to (i) receive, as the initial signal, a dynamically-generated, real-time differential pair signal in response to computerized operations performed by individual devices of the computer system, and (ii) preserve any pre-existing distortions in the dynamically-generated, real-time differential pair signal.

15. The apparatus of claim 14 wherein the output stage includes an output analog buffer circuit which is configured to output the distorted signal; and wherein the apparatus further comprises:

a switch coupled to the input analog buffer circuit, the switch being configured to switch between (i) a first position which connects the input analog buffer circuit to the control stage to output the distorted signal from the output analog buffer, and (ii) a second position which circumvents the control stage and the output analog buffer circuit to reintroduce the initial signal into the computer system.

16. The apparatus of claim 14 wherein the initial signal has an initial amplitude, and wherein the control stage includes:

an amplitude adjustment circuit which is configured to change the initial amplitude to a new amplitude which is different than the initial amplitude to provide at least part of the distortion forming the distorted signal.

17. The apparatus of claim 14 wherein the initial signal has an initial rise time, and wherein the control stage includes:

a rise time adjustment circuit which is configured to change the initial rise time to a new rise time which is different than the initial rise time to provide at least part of the distortion forming the distorted signal.

18. The apparatus of claim 14 wherein the initial signal has an initial fall time, and wherein the control stage includes:

a fall time adjustment circuit which is configured to change the initial fall time to a new fall time which is different than the initial fall time to provide at least part of the distortion forming the distorted signal.

19. The apparatus of claim 14 wherein the control stage includes:

a noise generator which is configured to introduce white noise as at least part of the distortion to form the distorted signal.

20. The apparatus of claim 14 wherein the individual devices of the computer system connect in a daisy-chained manner; and wherein the input analog buffer circuit includes:

circuitry configured to acquire, as the dynamically-generated, real-time differential pair signal, a point-to-point signal which is outputted from a first individual device of the computer system toward a second individual device of the computer system.

21. An apparatus for testing a computer system, comprising:

an input stage which is configured to intercept an initial signal of the computer system;

an output stage which is configured to introduce a distorted signal into the computer system in place of the initial signal; and means, coupled to the input stage and the output stage, for modifying the initial signal with a distortion to form the distorted signal, the means for modifying including means for enabling a user to select characteristics of the distortion to obtain, from the computer system, a result having one of (i) a first value indicating that the computer system handled the distorted signal in a normal operating mode, and (ii) a second value indicating that the computer system handled the distorted signal in an error handling mode which is different than the normal operating mode;

wherein the electronic system is a computer system, and wherein the input stage includes:

an input analog buffer circuit configured to (i) receive, as the initial signal, a dynamically-generated, real-time differential pair signal in response to computerized operations performed by individual devices of the computer system, and (ii) preserve any pre-existing distortions in the dynamically-generated, real-time differential pair signal.

22. The apparatus of claim 21 wherein the individual devices of the computer system connect in a daisy-chained manner; and wherein the input analog buffer circuit includes:

circuitry configured to acquire, as the dynamically-generated, real-time differential pair signal, a point-to-point signal which is outputted from a first individual device of the computer system toward a second individual device of the computer system.

* * * * *